United States Patent [19]

Hammond et al.

[11] 4,030,965

[45] June 21, 1977

[54] CRYSTAL GROWTH PROCEDURE

[75] Inventors: David A. Hammond, Willoughby Hills; Carl F. Swinehart, University Heights, both of Ohio

[73] Assignee: The Harshaw Chemical Company, Cleveland, Ohio

[22] Filed: June 9, 1976

[21] Appl. No.: 694,279

[52] U.S. Cl. .................... 156/616 R; 156/617 R; 156/624; 156/DIG. 71; 156/DIG. 78; 423/499; 423/497; 252/301.4 H

[51] Int. Cl.² ................ B01J 17/08; C01F 11/20; C01D 1/30; C01D 3/20

[58] Field of Search ............ 156/DIG. 71, DIG. 78, 156/616 R, 619, 621, 624; 423/499, 497; 23/302; 252/301.4 H

[56] References Cited

UNITED STATES PATENTS

| | | | |
|---|---|---|---|
| 792,632 | 6/1905 | Tee | 423/499 |
| 2,550,173 | 4/1951 | Swinehart | 423/497 |
| 2,666,145 | 1/1954 | Eversole | 156/DIG. 71 |
| 2,727,863 | 12/1955 | Fonda | 252/301.4 H |
| 2,984,626 | 5/1961 | Lefever | 252/301.4 H |
| 3,402,293 | 9/1968 | Shambon | 156/DIG. 71 |
| 3,565,700 | 2/1971 | Root | 423/499 |
| 3,826,817 | 7/1974 | Pastor | 423/499 |
| 3,837,882 | 9/1974 | Swinehart | 252/301.4 H |
| 3,926,566 | 12/1975 | Spurney | 156/617 R |

FOREIGN PATENTS OR APPLICATIONS

| | | | |
|---|---|---|---|
| 45-32527 | 4/1966 | Japan | 156/DIG. 71 |
| 1,137,582 | 12/1968 | United Kingdom | 156/DIG. 71 |
| 1,123,991 | 8/1968 | United Kingdom | 156/DIG. 71 |

OTHER PUBLICATIONS

Butler et al., A Method for Purif. and Growth of KCl Single Crystals, ORNL-3906, Feb. '66, p. 39.
Hinks et al., Journal of Crystal Growth, 15, No. 3, 1972, pp. 227–230.

*Primary Examiner*—Stephen J. Emery

[57] ABSTRACT

Inorganic macrocrystals are grown free of occluded gases in a quiescent melt in a Bridgmann, Stockbarger, or similar furnace by melting down the crystal feed stock under a reduced atmosphere composed primarily of a low molecular weight gas such as hydrogen, helium or neon having the ability to diffuse through the melt at a greater rate than that of nitrogen. The gas can also include a minor amount of one or more active scavenger gases. During crystal growth, the gas atmosphere over the melt is altered by replacing the low molecular weight gas with an inert gas having a lower solubility in the melt than that of the low molecular weight gas or by increasing the pressure of the low molecular weight gas at a specified point in the growth process to significantly increase the concentration needed to form bubbles in the melt and to retard evaporation of the melt.

9 Claims, No Drawings

CRYSTAL GROWTH PROCEDURE

BACKGROUND OF THE INVENTION

1. Field of the Invention

This invention is concerned with a method of growing macrocrystal ingots of inorganic salts, metals and solid solutions from a stratified melt. More particularly, the invention is directed to the growing of alkali metal or alkaline earth metal halides for use in optical and scintillation applications.

2. Description of the Prior Art

A well-known method of growing crystals involves establishing and maintaining a quiet melt of a feed crystal in an enclosed container, creating a thermal gradient surrounding the container with the heat passing vertically downward through the melt, and thereafter instituting the growth of the crystal from the bottom of the melt upward toward the top surface. This method is referred to as the Bridgmann procedure for growing metals, and the Stockbarger and Stober method for growing crystals from salts and solid solutions. In Stockbarger growth, fresh crystalline feed stock often with some recycled stock, contained in a non-reactive crucible is placed in a furnace on a vertically movable elevator. The furnace has two heating sections separated by a baffle. During growth, the upper section is heated to a temperature of about 50° to 150° C. above the melting point of the crystal while the lower section is maintained at a temperature below the melting point. Thus, the flow of heat is from the upper section downwards through the melt, and the inferface into the grown crystal and then into the cooler lower section. The temperature of the melt during this period of growth is higher at its upper surface than at the interface.

During meltdown of the charge, the crucible is positioned in the upper section of the furnace after which the air is evacuated from the furnace and is replaced with a gas such as nitrogen which will not react with the salt and which will serve to suppress evaporation of the melt. To this gas is often added a small amount, less than 10%, of a specific gas such as $CCl_4$ which reacts with an impurity known to exist within the melt.

After the salt is completely melted and a desirable temperature is established in the melt, the crucible is slowly lowered in the furnace past the baffle into the cooler lower section. The salt slowly crystallizes from the bottom of the melt on up as the temperature in the charge drops below the melting point in the vicinity of the baffle. The melt to crystal interface remains relatively stationary in horizontal proximity to the baffle with the slow downward movement of the crucible.

The temperature gradient in the melt along with interface position is maintained in a steady state condition by close control of power to the heaters. This also means a quiet melt, devoid of large convection currents, stratified as to temperature, density, dissolved gas concentration and in some instances, dopant concentrations during the growth process. Sensitivity and quality of the power control instrumentation is important for holding the correct heat flow through the growth cycle. Some factors at play in this balance are control thermocouple location, furnace size, crucible size, geometry of insulating refractory and heat conducting members of the furnace along with elevator position in the cycle.

For crucibles less than 3 inches diameter, the growth can be carried on without a change in the control temperature setting but for larger crystals adjustments are needed to hold the desired balance in heat flow and interface position.

The nitrogen atmosphere is maintained in the crucible throughout the entire meltdown cycle and the subsequent growth of the crystal. Typically during meltdown, a certain amount of the gas becomes dissolved in the feed stock, the amount depending upon the solubility of the gas in the melt, generally a function of molecular size of the gas molecules and the temperature of the melt. During growth, as a particular level in the melt approaches the liquid solid interface its temperature decreases, and the solubility of gas in the melt is likewise reduced. This, along with gas molecules rejected by crystal growth, creates a supersaturation of gas at the interface which can enlarge existing bubbles or even start new ones. These gas molecules must move upward in the melt or be trapped in the crystal. If the movement of the interface is faster than the upward movement of the rejected gas or if the transfer of heat through the interface is irregular and uneven, some of the gas will become entrapped in the solid crystal. This is likely to produce crystal defects which are evidenced in several ways including bubbles, bubble pipes, and blow holes, readily visible within transparent crystals, and boundary decorations. These are formed along mosaic boundaries and component boundaries. Although optically not particularly troublesome, these decorations do weaken the macrocrystal and reduce its effectiveness and utility in hot forming into shape.

Some gas inclusions in melt grown crystal are of such small size that they give an insignificant amount of light scatter. But if the ingot is hot formed by forging, extrusion or the like, they may collect into voids of objectionable size.

Prior to the present invention, none of the commercial ingots over 5 inches diameter have yielded completely clear forgings. Virtually all of these have involved component boundaries but the problem of gas inclusions also extends to mosaic boundaries that are present in all crystal grown from a melt by any of the known methods.

If it is evident that gas inclusion is occurring at the growth interface, the rate of crystal growth must be decreased to allow sufficient time for the remaining dissolved gases to diffuse away from the interface. Alternatively, other changes or adjustments must be made in the furnace equipment or in the controls to effectively slow down the growth rate. This, in turn, can create a shift in the thermal gradient and localized supercooling at the melt interface and an uneven dendritic form of crystal growth with the entrapment of dissolved gases and other impurities in the melt between dendrite arms.

Furthermore, procedural changes in crucible loading, stock preparation, heating rate and the like may eliminate or minimize the problem of bubble formation in one furnace or with one given growth stock within the furnace but will not necessarily be applicable to another furnace or another growth stock.

Prior efforts to solve this problem have been unsuccessful and no one has attached any particular significance to the role that the gases and pressures used during meltdown and growth play in the formation of bubbles within the melt and entrapment of gaseous impurity in the crystal.

In their article entitled "Growth of Alkali — Halide Crystals in Various Gas Atmospheres" appearing in Kristallografiya 8 (6) 940–942, Nov. 1963, trans. p. 757–8, Tsal' et al describe the growing of NaI(Tl) in a helium atmosphere and find no advantage over growth in a nitrogen atmosphere. In both instances, bubbles and bubble pipes are noted.

VanSciver reported in *Physics Review* 120 (4) 1193, (1960) that he grew thallium activated sodium iodide in an atmosphere using hydrogen as a carrier for $I_2$ but made no comment upon the quality of the crystal or upon any connection between atmosphere, gas pressures and growth rate.

Likewise Brinckmann in U.S. Pat. No. 3,446,745 in growing CsI(Na) uses, in Example 1, a helium atmosphere during crystal growth which proceeds at a rate of 1.4 mm per hour in 500 g. crystals, approximately 2½ inches diameter. This is the same rate of growth that he obtains in Example 2 when using a mixture of 10% hydrogen and 90% argon.

In November, 1973, Reichelt and Stark presented a report at the Third Conference on High Power Infra-Red Laser Window Materials describing high power laser damage to alkali halide crystals, suggesting that they are possibly attributable to absorbed gases in the crystals.

Bridgmann has also commented upon troubles caused by bubble inclusions in metal ingots.

It has been noted that in smaller crystals less than three or four inches in diameter, the problem can be readily controlled. However, as larger ingots are grown, the problem of bubble inclusion becomes more pronounced and of greater economic importance. The problem has been most readily controlled by careful purification of and growth of stock to avoid insoluble solids that can start a bubble and growth at a slow rate.

BRIEF DESCRIPTION OF THE INVENTION

The present invention relates to a method of achieving more rapid crystal growth of ingots larger than 3 inches or 4 inches in diameter by using one set of atmospheric conditions for meltdown of the growth stock, and a different set of conditions during the quiescent phase of crystal growth. Among the objects and advantages to be achieved by the present invention are the following:

a. it serves to reduce the inclusion of gas bubbles, gas pipes, blow holes and other irregularities into a crystal grown from a stratified melt.

b. it allows an increase in the overall growth rate of the ingot by as much as 100% and aids in maintaining a more uniform growth rate.

c. it helps to minimize the effect of procedural variations in stock preparation, loading, meltdown, etc. on the clarity and quality of the crystal.

d. it applies to metals, to salts and to solid solution crystals that are grown by Stockbarger, Bridgmann or other stratified melt procedures.

e. it encourages growth of 4 inches and larger optical and scintillation crystal ingots from alkali metal halides in a Stockbarger furnace at growth rates greater than 1.5 mm per hour.

f. it permits the formation of defect-free ingots that can be extruded, forged or otherwise hot-shaped into polycrystalline products free of visible inclusions, an objective not heretofore realized with either Stockbarger or Kyropoulos grown crystals. Typically prior art forgings of NaCl crystals from which 16 inches diameter windows are cut contain irregular areas less than 1 inch minor diameter that are free of these defects.

These and other advantages and objectives are achieved in a manner to be hereinafter described in detail by utilizing one set of atmospheric conditions surrounding the crystal feedstock during meltdown, and thereafter utilizing a different set of atmospheric conditions during the crystal growth. The first set of conditions are selected so as to favor the use of a gas having a relatively high rate of diffusion through the melt, thus ensuring more rapid gas removal during crystal growth. This involves the use of a low molecular weight gas such as hydrogen, neon or helium, either alone or with a small amount of a reactive gas useful as a scavenger in the melt, at a reduced pressure during meltdown.

After establishing a temperature gradient in the melt and during the growth procedure, the pressure over the melt is increased, preferably by a factor of 5 or more by adding more gas. The added gas can be the same as that used in meltdown but preferably a heavier inert gas such as nitrogen is added. This added pressure serves to reduce the tendency for bubbles to start or enlarge in the melt and to avoid evaporation of the melt. Also the size and rate of incremental changes in control instrument settings for temperature is limited to avoid convection stirring that would aid the downward transfer of gas in the melt during growth under the higher pressure. The limit for this depends upon many factors but for halide melts in crucibles 6 inches to 30 inches diameter temperature changes faster than 5° per hour are not necessary nor desirable.

DETAILED DESCRIPTION OF THE INVENTION

The present invention is applicable to the growth of ingots from metals, crystal salts and solid solutions, wherein crystal growth proceeds in an upward direction within a stratified melt. This includes growth in Stockbarger, Bridgmann and other furnaces wherein the movement of the melt through convection, thermal or mechanical stirring, agitation and vibration do not occur. The invention is particularly applicable to the growth of pure and doped inorganic crystal salts including alkali metal halides such as sodium chloride, sodium iodide, potassium chloride, potassium bromide, sodium fluoride, lithium fluoride, lithium iodide, cesium bromide, and cesium iodide; and alkaline earth metal halides such as calcium fluoride, barium fluoride, strontium fluoride, cadmium fluoride, and magnesium fluoride. It is also applicable to bismuth, to $Mg_2Sn_{0.7}Pb_{0.3}$, to aluminum, to anthracene, to stilbene, to other salts such as sodium nitrate, thallium bromide-iodide (KRS-5), silver chloride and silver bromide and to any salt, metal or solid solution that requires a gas atmosphere over the melt for any reason to retard evaporation of the melt during meltdown or crystal growth, to assist in the purification of the melt, to act as a carrier for a reagent or simply for convenience in furnace operation and crystal handling.

Within the definition of stratified melt is included the growth of doped inorganic salt melts wherein very slight movement at the interface between the liquid and the solid is employed to avoid the natural build-up of dopant in channels or lines at the crystal grain boundaries. However, this very slight movement is insufficient to cause stirring or agitation of the melt and does not disrupt the temperature gradient in the melt or flow of heat through the interface and does not aid the downward movement of dissolved gas.

Growth processes such as stirred melts, Kyropoulos growth, horizontal boats, float zone or rotating horizontal ampules, because these involve movement of the melt and excessive contact with the atmosphere, are not included within the scope of this invention, and in fact do not benefit from the teachings of the same.

For the growth of inorganic salt ingots useful for optical and scintillation purposes, a furnace charge is prepared by introducing a highly purified salt, as a powder, small crystals and recycled scrap, into a container such as a platinum crucible generally having a conical bottom. The salt is normally charged into the crucible in a dry atmosphere to avoid the effects of hydroscopicity if any. If the crystal ingot is to be used for the manufacture of scintillators, the dopant is also introduced into the crucible. A lid is placed on the crucible which is then positioned on a cone holder mounted atop a vertically movable shaft in the top section of a two-zone Stockbarger furnace. The feedstock is then melted down and a temperature gradient established in the melt after which crystal growth is initiated in the cone as previously described.

During meltdown of the crystal feedstock, the air having been evacuated from the furnace is replaced by a non-reactive or inert gas having a molecular weight less than that of nitrogen. The gas is selected from the group consisting of hydrogen, helium and neon as well as mixtures of any two or all three of the same. It can be used as a carrier for a reactive gas that serves to remove contaminants from the melt, or to suppress undesirable side reactions. For example, HF, HCl, HBr, or HI gas is used to control hydrolysis of alkali halides, hydrogen is used to remove or reduce sulfate ions and cyanate ions while $CCl_4$ is used to react with carbonate and other oxides. The concentration of this reactive gas in the light gas is generally less than 10 mole percent and preferably less than 1% or even 0.1% except when hydrogen serves both functions in which case it can be any fraction.

Each of the gases hydrogen, helium and neon has a lower molecular weight than that of nitrogen. According to wellknown principles of physical chemistry, the diffusion rate of a gas in a liquid is inversely proportional to the square root of the molecular weight. For example, helium has a molecular weight of 4 and diffuses at a rate of about 2.8 times as fast as nitrogen which in its diatomic form has a molecular weight of 28. Similarly, hydrogen diffuses at a rate of about 5.3 times that of nitrogen. Because of the similarity in molecular weights between neon and nitrogen, neon diffuses only slightly faster than the nitrogen. In any event, as the dissolved gas is rejected by the growing crystal, it must diffuse away from the growth interface in an upward direction through the melt, unaided by melt stirring or convection.

Even though the diffusion rate of helium, hydrogen and neon is greater than that of nitrogen, the solubility of these three gases in the melt, due to their smaller molecular structure is also higher than that of nitrogen. For this reason, the meltdown is preferably carried out at a reduced pressure of between 60 and 125 mm of mercury to minimize the quantity of gas available to be dissolved in the melt. However, the use of a reduced pressure must be counterbalanced by the greater tendency of the salt in the melt to evaporate at low pressures. In other words, sufficient pressure must be maintained on the melt to minimize vaporization of the salt from the melt. With alkaline earth metal fluorides in furnaces made of graphite, the vapors do not create serious problems. However, because the alkali metal halides are more corrosive, their vaporization and loss from the crucible and subsequent sublimation on the metal heater windings and refractory parts of the furnace can cause damage to the equipment.

Following the meltdown, crystal growth proceeds under substantially steady state conditions. The atmosphere used during the meltdown is changed to a growth atmosphere utilizing a gas or a mixture of gases that will provide the optimum environment for crystal growth. This can include the use of nitrogen, argon, xenon, $CO_2$, $CF_4$, $SF_6$ or mixtures of the same, considering factors such as:

a. the molecular weight of the gas and its effect upon diffusion of dissolved gas downward away from the surface of the melt b. the solubility of the gas in the melt, and c. the thermal conductivity of the gas and the effect of this conductivity upon the temperature requirements, temperature gradient, dopant distribution, etc., in the melt. Crystal growth is preferably carried out under a gas pressure at least 5 times that used during meltdown.

That this new procedure applies to melts of so many different substances is because the gases of principle concern are either inert or nonpolar as classified in Inyushkina and Vil'nyanski (Fig. Khim., Elecktrokhim., Raspavl., Solei Tverd. Electrolitov, 1973, No. 1, p. 114–16) i.e., gases with zero or low dipole moments, less than 0.9 Debye units. For these two categories, "inert" or "nonpolar" gases, solubility is controlled by the free volume in the melt and the size of the gas molecules, so they behave as described above for temperature and pressure changes. Some of the active vapors are in the "polar" classification, dipole moment over .9, but these are optional and are used in very small quantities. It further follows if these classifications hold that the use of $CO_2$ for the high pressure gas is a marginal choice especially for fluoride melts, cesium salts, thallium salts and of course for most metals, but there are other good gases, $N_2$ or Ar, with which to work.

The same gas that is used during meltdown at reduced pressure can also be used, but at atmospheric pressure, during growth provided the pressure increase is at least five fold and is made while the melt is quiescent.

Specific embodiments of the invention include, but are not limited to the following:

1. the use of hydrogen for meltdown at reduced pressure followed by growth of the crystal at atmospheric pressure using nitrogen or a mixture of argon and nitrogen, with or without the inclusion of a small amount, for example 4% of hydrogen to prevent oxidation; (4% being chosen to avoid explosive mixtures).

2. the use of a mixture of hydrogen and helium for meltdown at reduced pressure followed by growth under nitrogen, argon, xenon or other heavier inert gas at atmospheric pressure;

3. meltdown with helium or a mixture of helium and hydrogen at 60 – 125 mm of mercury followed by crystal growth using the same gas or gases at atmospheric pressure;

4. the use of any of the reactive gases in an amount up to 10% along with helium, hydrogen, neon or mixtures thereof at reduced pressures during meltdown followed by the use of a conventional atmosphere or sweep of inert gas for crystal growth.

Although it is possible to carry out crystal growth under reduced pressures, thus reducing the amount of inert gas that dissolves in the melt, this does not change the bubble problem because the volume of dissolved gas at a given temperature is a constant. All of the gases in question follow Henry's law and the ideal gas law for melts of crystals solidifying above room temperature. In our procedure of increasing the pressure on the stratified quiet melt it appears that even though the surface of the melt quickly becomes saturated with gas, the downward diffusion of the gas from the surface into the melt is very slow. Thus, the benefits of growing at less than atmospheric pressure are minimal in comparison with the advantages afforded by the present invention.

Although not controlling, the thermal conductivity of the gas used for growth does have an effect upon the thermal gradient in the furnace. If a highly conductive gas is used during growth, a larger amount of heat is normally transmitted away from the surface of the crucible below the growth interface, thus requiring higher temperatures in the upper section of the furnace. This in turn increases the solubility of the gas in the melt, the quantity of dissolved gas and the energy requirements of the furnace and in addition may change the distribution of an added dopant by virtue of more heat flow through the interface.

After the crystal ingot has been completely formed, it is removed from the furnace and is melted out of the crucible after which it is slowly cooled to room temperature, generally with an annealing step. The crystal ingot can then be subjected to any number of treatments including forging, extrusion, machining, etc., at room temperature or at elevated temperatures.

EXAMPLE I

As a specific example of the present invention, a scintillation crystal ingot was prepared by charging 6 kg. of a purified mixture of sodium iodide and about 0.22 wt. percent thallium iodide into a 6 inch diameter platinum crucible having a conical bottom. The crucible was placed in a Stockbarger type furnace and a vacuum was pulled until the outgas rate was less than 0.1 microns in 10 minutes while heating to 125° C. Helium gas was then added to 125 mm and the furnace heated to a set point temperature of 900° C. and held 4 hours without adding more gas. From the position of the crucible relative to the control and recording thermocouples, it was estimated that the temperature in the melt ranged from 710° at the bottom to between 850° and 900° C. at its surface. The temperature control set point was then lowered from 900° to 835° C. and after about ½ hour nitrogen was added at a slow rate to bring the furnace pressure up to one atmosphere. After crystal growth started the elevator was turned on to run at a steady speed of 2.1 mm per hour. Following the increase in pressure and until the end of growth, temperature changes were programmed at rates less than 5° C. per hour following a program which from previous runs in the same equipment held a steady interface level as the elevator moved down. On completion of growth the ingot was removed from the growth furnace, inverted and placed in a meltout furnace where the crucible was removed. The crystal was then moved to an annealing furnace, the controls for which were driven down at 7°/hr. from about 600° C. to room temperature.

The grown crystal was visually inspected and was found to be free of gas inclusions and decorated boundaries. A 3 inch × 3 inch cylinder cut from the ingot gave 7.5% resolution when tested for scintillation using a 667 MeV gamma source at room temperature.

Another thallium doped sodium iodide crystal was grown at the same rate under identical conditions but using nitrogen at 125 mm of pressure in place of the helium for the meltdown. The resultant ingot was found to contain many bubble pipes. Clear ingots, free of gas inclusions, can however be grown under similar conditions at a rate of 1 mm per hour, less than 50% of the growth rate achievable when helium is used at reduced pressure for meltdown.

Although a difference in growth rate of 1.1 mm per hour may be regarded as insignificant numerically, it should be noted that the normal growth rate for a NaI crystal having a 17 inch diameter and 12 inch shoulder height is about 300 hours. By practicing the teaching of the present invention, the growth time is reducted to 150 hours. Added to this is another 40 hours for pump down and melting, giving a total of 340 hours as opposed to 190 hours. Thus, the instant invention results in an increase in furnace capacity of as much as 80% — a totally unexpected and surprising result.

EXAMPLE 2

A 14 inch diameter platinum crucible was loaded with 45 kg of crystal grade sodium chloride. The crucible was placed in the upper section of a Stockbarger furnace enclosed in a jacket for evacuation and for control of the atmosphere surrounding the crystal. The upper and lower sections of the furnace were heated to 550° C. and were then evacuated to 0.05 mm after which helium was admitted to a pressure of 125 mm of Hg. For meltdown, the temperature control for the furnace was set at 980° C. After the charge had melted, the temperature was maintained constant for 6 hours after which the heater in the bottom section of the furnace was turned off. The melt and held was 6 more hours for clarification and to establish a vertical temperature gradient after which the temperature in the top section was dropped 50° C. After one hour, nitrogen was slowly admitted over a period of 1 or 2 hours until atmospheric pressure was attained.

During crystal growth, the furnace elevator was lowered at a uniform rate of 1.2 mm per hour and the temperature was controlled so that the rate of temperature change was less than 5° C. per hour.

The crucible containing the solidified ingot was inverted and was transferred to a melt-out furnace maintained above the melting temperature of the sodium chloride where the crucible was removed from the ingot. The ingot was then placed in an annealing furnace where it was brought from 700° C. to room temperature at approximately 7° per hour.

The heel and cone sections of the crystal were scrapped, after which a 6 inch thick clear cylindrical section was cut from the ingot. This section was placed between heated plates in a forging press and the temperature was raised to 400° C. at 7° per hour. The ingot was compressed to a thickness of 3⅝ inch after which it was annealed in the press to room temperature at 5° per hour.

After cutting, grinding and polishing to final dimensions, the window, 16 inches in diameter, was compared for optical quality with a similar window forged from a conventionally grown sodium chloride crystal and was found to have fewer gas inclusions when inspected in a Tyndall beam of visible light. The windows were clear while those forged from conventional crystals scattered visible light because of isolated voids, decorations and remnants of component boundaries. Many of the gas inclusions in the forged window made from conventional ingots were undetectable until the ingot was forged at which time they collected along boundaries and caused visible scattering of the light.

The minute voids in forgings made from conventional ingots may not measurably affect absorption of 10.6 micrometer light, however, they do lower the threshold of damage for nonosecond, high energy 10.6 micrometer laser pulses. It is possible to increase the energy of these pulses by 50% without damage to the window, compared to windows prepared by forging of conventional ingots. The latter sustain surface damage when subjected to 3.0 joule/cm$^2$ nanosecond pulses.

EXAMPLE 3

A 3½ inch diameter platinum crucible was loaded with 1.5 kg of potassium chloride crystals that have been washed, dried and crushed to pea size. Sufficient europium chloride was added with the potassium chloride to make a charge containing 0.020 mole percent europium. The crucible was placed in the upper section of a Stockbarger furnace which was evacuated and was slowly heated to 400° C. at a heating rate which maintained the pressure of not over 1 micron of mercury. When the outgas rate was less than 0.3 microns in 10 minutes at 400° C., hydrogen containing 4 mole percent CCl$_4$ was introduced to a pressure of 25 mm. The temperature was set at 920° C. for 6 hours during which the charge melted and became stratified with a vertical temperature gradient. The control temperature was then set to 890° C. after which argon was added for a period of 3 hours to reach atmospheric pressure. The crucible was then lowered at a uniform rate of 1.1 mm per hour and upon completion of growth, the crucible and ingot were transferred to a melt-out furnace and were separated. The ingot was then annealed from 700° C. to room temperature at 7° per hour.

The grown crystal was inspected using a Tyndall beam of visible light and was found to contain no decorated boundaries. A window forged from the KCl(Eu) in a manner similar to that used in Example 2 gave a yield strength of over 3,000 PSI and an absorption coefficient less than 0.0005 cm$^{-1}$ at 10.6 micrometers. The extremely high strength and low absorption are both achieved through the avoidance of decorated boundaries in the ingot due to the growth, according to the teachings of the present invention.

It should be noted in both Examples 2 and 3 that the growth rate used in the Stockbarger furnace were considerably below maximum growth rates that could be obtained. However, since the objectives are the growth of ingots completely free from visible voids in Example 2 and decorated boundaries in Example 3, the slower growth rates are warranted.

The foregoing description and examples have been presented to clearly show the utility and applicability of the present invention in the growth of high quality, optically integral macro-crystalline ingots. It is to be understood, however, that the present invention is not to be limited in scope to the specific parameters embodied herein.

Instead, the invention is to be measured in terms of the claims in which I claim:

1. A method of growing a macrocrystal ingot of a material selected from the group consisting of an alkali metal halide and an alkaline earth metal halide in a Stockbarger furnace comprising placing a crucible charged with the salt into the furnace, heating the salt to melt the same and slowly growing the ingot under quiescent conditions with the growth commencing at the bottom of the crucible and moving upward, the improvement comprising melting down the salt while in contact with a gas composed primarily of helium, hydrogen or a mixture of the two at a reduced pressure of between 60 and 125 mm of mercury and thereafter growing the ingot from said melt in contact with an inert gas maintained at a higher pressure of at least five times that used during the meltdown.

2. The method of claim 1 wherein the gas used during meltdown includes less than 10% of a reactive gas.

3. The method according to claim 2 wherein the meltdown gas contains less than 1% of a reactive gas.

4. The method of claim 1 wherein the same gas used during meltdown is also used during crystal growth.

5. The method of claim 1 wherein the gas used during meltdown is replaced during crystal growth with a gas selected from the group consisting of nitrogen, argon, xenon, CO$_2$, CF$_4$, and SF$_6$ at atmospheric pressure.

6. The method according to claim 1 wherein nitrogen is used as the gas during crystal growth.

7. The method of claim 1 wherein helium is used at atmospheric pressure during crystal growth.

8. The method according to claim 1 wherein the crystal being grown is composed of sodium iodide activated with a minor amount of thallium.

9. A crystal ingot prepared according to the process of claim 1.

* * * * *